(12) United States Patent
Elliot et al.

(10) Patent No.: US 10,200,004 B2
(45) Date of Patent: *Feb. 5, 2019

(54) LAST MILE EQUALIZATION

(71) Applicant: BOSE CORPORATION, Framingham, MA (US)

(72) Inventors: Michael W. Elliot, Grafton, MA (US); Debasmit Banerjee, Brighton, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/028,567

(22) Filed: Jul. 6, 2018

(65) Prior Publication Data

US 2019/0013788 A1    Jan. 10, 2019

Related U.S. Application Data

(63) Continuation of application No. 15/642,428, filed on Jul. 6, 2017, now Pat. No. 10,038,419.

(51) Int. Cl.
*H04R 3/12* (2006.01)
*H03G 5/16* (2006.01)
(Continued)

(52) U.S. Cl.
CPC ............. *H03G 5/165* (2013.01); *G06F 3/165* (2013.01); *G06F 3/167* (2013.01); *G10L 15/08* (2013.01);
(Continued)

(58) Field of Classification Search
CPC ...... H03G 5/165; H04R 3/12; H04R 2430/01; G10L 2015/088; G10L 15/08; G06F 3/165; G06F 3/167
See application file for complete search history.

(56) References Cited

U.S. PATENT DOCUMENTS 9,053,710 B1    6/2015   Zehr et al.
2010/0232626 A1   9/2010   Paquier et al.
(Continued)

FOREIGN PATENT DOCUMENTS

EP    2267695 A2    12/2010

OTHER PUBLICATIONS

International Search Report and Written Opinion from corresponding International Application No. PCT/US2018/039477 dated Oct. 17, 2018.

*Primary Examiner* — Sonia L Gay
(74) *Attorney, Agent, or Firm* — Lando & Anastasi, LLP

(57) ABSTRACT

An audio playback system performs a method including identifying a first type of audio included in a first audio stream, tagging the first audio stream with a first digital tag corresponding to the first type of audio, identifying a second type of audio included in a second audio stream, tagging the second audio stream with a second digital tag corresponding to the second type of audio, rendering the first audio stream with a first equalization profile applied thereto, the first equalization profile selected responsive to the audio playback system detecting the first digital tag in the first audio stream, and rendering the second audio stream with a second equalization profile different than the first equalization profile applied thereto, the second equalization profile selected responsive to the audio playback system detecting the second digital tag in the second audio stream.

31 Claims, 8 Drawing Sheets

(51) Int. Cl.
   *G06F 3/16*        (2006.01)
   *G10L 15/08*       (2006.01)

(52) U.S. Cl.
   CPC .......... *H04R 3/12* (2013.01); *G10L 2015/088* (2013.01); *H04R 2430/01* (2013.01)

(56) References Cited

U.S. PATENT DOCUMENTS

| | | |
|---|---|---|
| 2012/0121096 A1 | 5/2012 | Chen et al. |
| 2013/0245798 A1 | 9/2013 | Kallai et al. |
| 2015/0067016 A1 | 3/2015 | Park et al. |
| 2015/0086033 A1 | 3/2015 | Tebbs et al. |
| 2017/0094409 A1 | 3/2017 | Baumgarte |
| 2017/0236512 A1 | 8/2017 | Williams et al. |
| 2017/0242653 A1 | 8/2017 | Lang et al. |
| 2018/0006869 A1 | 1/2018 | Zhang et al. |

LAST MILE EQUALIZATION

CROSS-REFERENCE TO RELATED APPLICATIONS

This application claims priority under 35 U.S.C. § 120 as a continuation of U.S. patent application Ser. No. 15/642,428, titled "LAST MILE EQUALIZATION", filed Jul. 6, 2017 which is incorporated herein in its entirety for all purposes.

TECHNICAL FIELD

Aspects and implementations of the present disclosure are directed generally to audio players including functionality for both playing audio content such as music and for providing audio responses to commands or queries by a user.

BACKGROUND

Virtual personal assistants (VPAs) are devices that respond to user queries, which may be in the form of spoken queries, by searching for a response to the query of the user in a database, for example, the internet and providing the response to the user, often in the form of an audible response such as synthesized speech. VPAs may also respond to user commands to play audio from a specified audio source, for example, an internet radio station, or to control a smart device, for example, to turn on or off a light or change a setting of another smart device that the VPA has access to, for example, via Wi-Fi signals either directly or through an internet router of the user. Queries or commands are typically provided to a VPA by a user after the user says a wake up word or phrase, for example, "Alexa" that indicates to the VPA that the user is addressing the VPA. VPAs are becoming more prevalent with various companies providing competing devices, for example, the Echo™ VPA from Amazon, Google Home™ VPA from Google, and various devices incorporating the Siri™ application from Apple. Smart speaker systems may include functionality to both stream music or other audio content and to function as VPAs.

SUMMARY

In accordance with an aspect of the present disclosure, there is provided an audio playback system including a processor and associated programming The programming, when executed on the processor, causes the audio playback system to perform a method comprising identifying a first type of audio included in a first audio stream, tagging the first audio stream with a first digital tag corresponding to the first type of audio, identifying a second type of audio included in a second audio stream, tagging the second audio stream with a second digital tag corresponding to the second type of audio, rendering the first audio stream with a first equalization profile applied thereto, the first equalization profile selected responsive to the audio playback system detecting the first digital tag in the first audio stream, and rendering the second audio stream with a second equalization profile different from the first equalization profile applied thereto, the second equalization profile selected responsive to the audio playback system detecting the second digital tag in the second audio stream.

The audio playback system may include a master streaming audio player and at least one slave streaming audio player, the at least one slave streaming audio player configured to render the first audio stream and the second audio stream under control of the master streaming audio player.

In some implementations, the at least one slave streaming audio player is configured to identify a spoken user query and communicate the user query to the master device, and wherein the master streaming audio player is configured to generate a response to the user query and communicate the response to the user query in the first audio stream to the at least one slave streaming audio player for rendering, the first tag included in the first audio stream identifying the first audio stream as including the response to the user query.

In some implementations, the at least one slave streaming audio player may reduce a volume of an audio stream being rendered through the at least one slave streaming audio player responsive to detecting a wake word spoken by the user.

In some implementations, only a slave streaming audio player that identifies the user query renders the response to the user query. In other implementations, each streaming audio player in the system renders the response to the user query.

In some implementations, the at least one slave streaming audio player is configured to identify the first tag in the first audio stream and to apply the first equalization profile to the response to the user query responsive to identifying the first tag.

In some implementations, the master streaming audio player is further configured to communicate the second audio stream to the at least one slave streaming audio player, the second tag in the second audio stream identifying the second audio stream as including audio other than the response to the user query, and the at least one slave streaming audio player is configured to identify the second tag in the second audio stream and to apply the second equalization profile to the second audio stream responsive to detecting the second tag. The master streaming audio player may be further configured to communicate a third audio stream including an audio chime to the at least one slave streaming audio player, the third audio stream including a third tag identifying the third audio stream as including the audio chime, and the at least one slave streaming audio player is configured to identify the third tag in the third audio stream and to apply a third equalization profile different from the first equalization profile to the third audio stream responsive to detecting the third tag.

In some implementations, the first equalization profile and second equalization profile are programmed into and associated with the respective first and second tags in the at least one slave streaming audio player.

In some implementations, if the at least one slave streaming audio player receives an audio stream including the first tag while rendering the second audio stream, the at least one slave streaming audio player reduces a volume of the second audio stream and renders the audio stream including the first tag at a higher volume relative to the second audio stream.

In accordance with another aspect, there is provided a method comprising receiving a user query spoken by a user at a microphone of an streaming audio player, rendering a speech response to the user query with the streaming audio player with a first equalization profile applied to the response to the user query, and rendering entertainment audio with the streaming audio player with a second equalization profile different than the first equalization profile applied to the entertainment audio.

In some implementations, the streaming audio player is a slave streaming audio player operating under control of a master streaming audio player and the method further comprises communicating the user query from the slave streaming audio player to the master streaming audio player and communicating the response to the user query from the master streaming audio player to the slave streaming audio player.

The method may further comprise the master streaming audio player communicating the user query to a cloud-based service and receiving the response to the user query from the cloud-based service.

The method may further comprise the master streaming audio player including a first indicator identifying a first audio stream as including the response to the user query in the first audio stream, wherein communicating the response to the user query from the master streaming audio player to the slave streaming audio player comprises communicating the first audio stream from the master streaming audio player to the slave streaming audio player.

In some implementations, the slave streaming audio player applies the first equalization profile to the response to the user query responsive to identifying the first indicator in the first audio stream.

The method may further comprise the master streaming audio player including a second indicator identifying a second audio stream as including the entertainment audio in the second audio stream, wherein the slave streaming audio player renders the entertainment audio with a second equalization profile applied thereto responsive to identifying the second indicator in the second audio stream.

In some implementations, the slave streaming audio player reduces a volume of entertainment audio being rendered on the slave audio device responsive to receiving the first audio stream and identifying the first indicator in the first audio stream and the slave streaming audio player renders the response to the user query at an increased volume relative to the volume of the entertainment audio.

The method may further comprise the streaming audio player streaming the entertainment audio from a streaming music service.

In some implementations, the streaming audio player identifies a wake word preceding the user query and lowers a volume of the entertainment audio responsive to identifying the wake word.

In accordance with another aspect, there is provided a streaming audio player. The streaming audio player comprises a digital-to-analog converter, an electro-acoustic transducer coupled to the digital-to-analog converter, a network interface, a processor coupled to the digital-to-analog converter, and the network interface, and instructions stored on a non-transitory computer readable medium. When executed, the instructions cause the processor to receive first digital audio data via the network interface, select a first equalization profile from a plurality of equalization profiles based on a first digital tag associated with the first digital audio data, and equalize the first digital audio data according to the first equalization profile.

In some implementations, the first digital audio data comprises a response to a voice request that is received from a cloud-based service, and the instructions, when executed, further cause the processor to append the first digital tag to the first digital audio data, wherein the first equalization tag identifies the first digital audio data as being a response to a voice request. The instructions, when executed, may further cause the processor to transmit the first digital audio data, with the first digital tag appended thereto, to one or more other streaming audio players via the network interface for rendering of the first digital audio data on the one or more other streaming audio players.

In some implementations, the instructions, when executed, further cause the processor to receive second digital audio data via the network interface, select a second equalization profile from the plurality of equalization profiles based on a second digital tag associated with the second digital audio data, and equalize the second digital audio data according to the second equalization profile, wherein the second equalization profile is different from the first equalization profile. The streaming audio player may be configured to render the first digital audio data, as equalized according to the first equalization profile, and the second digital audio data, as equalized according to the second equalization profile, concurrently. The streaming audio player may be configured to reduce a volume of the rendered second digital audio data while it is rendering the first digital audio data.

In some implementations, the instructions, when executed, further cause the processor to append the second digital tag to the second digital audio data, wherein the second equalization tag identifies the second digital audio data as entertainment audio data. The instructions, when executed, may further cause the processor to transmit the second digital audio data, with the second digital tag appended thereto, to one or more other streaming audio players via the network interface for rendering of the second digital audio data on the one or more other streaming audio players. The streaming audio player may be configured to transmit the first digital audio data and the second digital audio data concurrently to the one or more other streaming audio players.

In some implementations, the streaming audio player is configured to receive a voice request from a user, transmit the voice request via the network interface to a cloud-based service, and receive a response to the voice request via the network interface from the cloud-based service, wherein the response comprises the first digital audio data. The streaming audio player may comprises a microphone, and the voice request may be received via the microphone. The voice request may be received via the network interface from another streaming audio player.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1A:
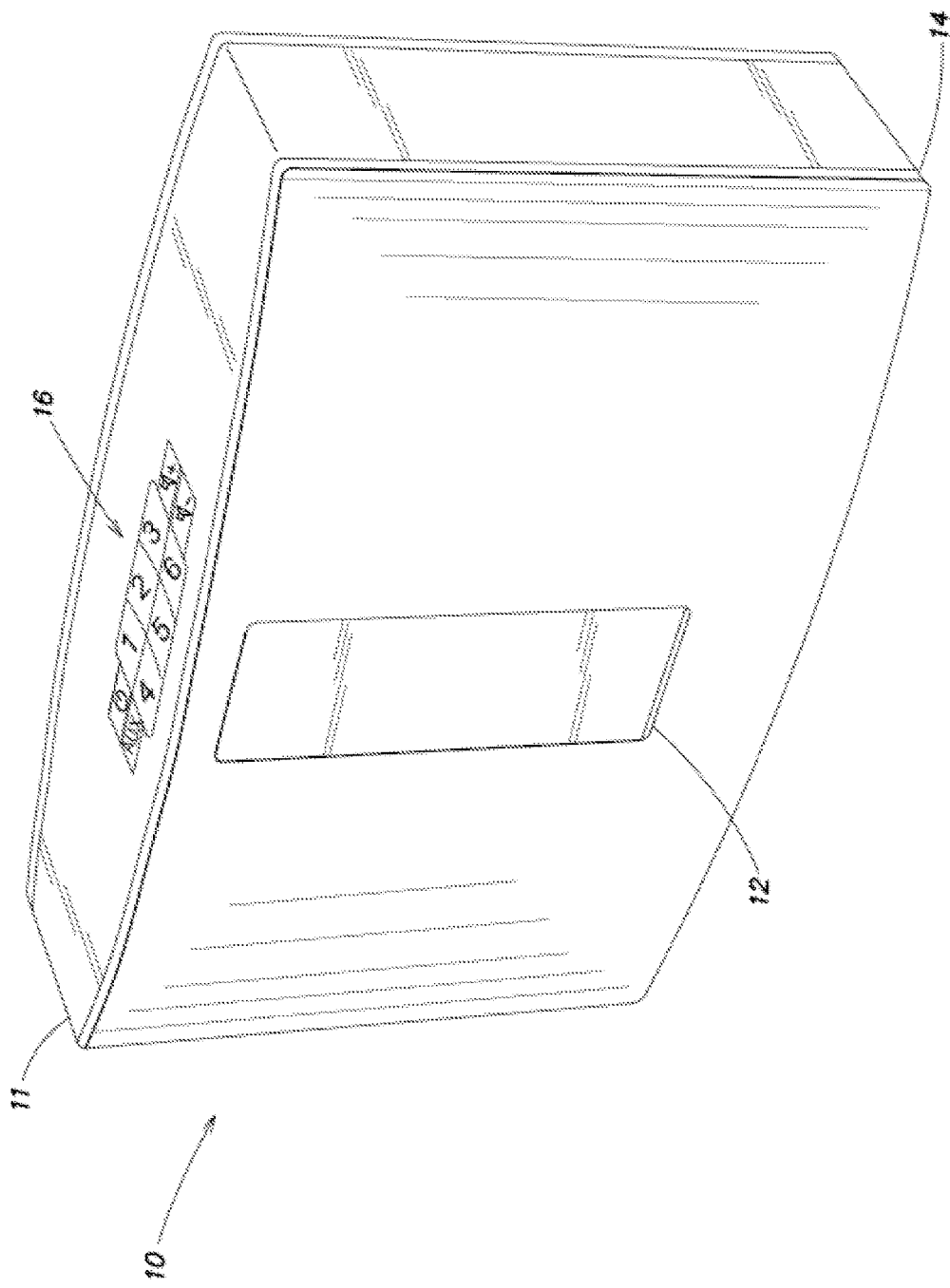
FIG. 1A is an isometric view of an embodiment of a streaming audio player including VPA functionality.

Aspects and implementations disclosed herein are not limited to the details of construction and the arrangement of components set forth in the following description or illustrated in the drawings. Aspects and implementations disclosed herein are capable of being practiced or of being carried out in various ways.

Aspects and implementations disclosed herein may be applicable to a wide variety of audio players, for example, streaming audio players or smart speaker systems that may incorporate virtual personal assistant (VPA) functionality or smart speakers that communicate with a VPA. Aspects and implementations of audio players disclosed herein include functionality that renders the audio players capable of differentiating between different forms of content in audio streams and rendering the audio streams in a manner that varies based on the type of content. For example, when an audio player is providing a response to a user query or command, it may render the response with a first equalization or frequency response. When the audio player is playing music, it may render the music with a second equalization or frequency response. In some implementations, an audio player may be playing entertainment audio and responsive to detecting a wake up word or phrase may lessen the volume of the entertainment audio, await a query or command from a user, and respond to the query or command of the user prior to resuming play of the entertainment audio at the original volume.

Figure 1B:
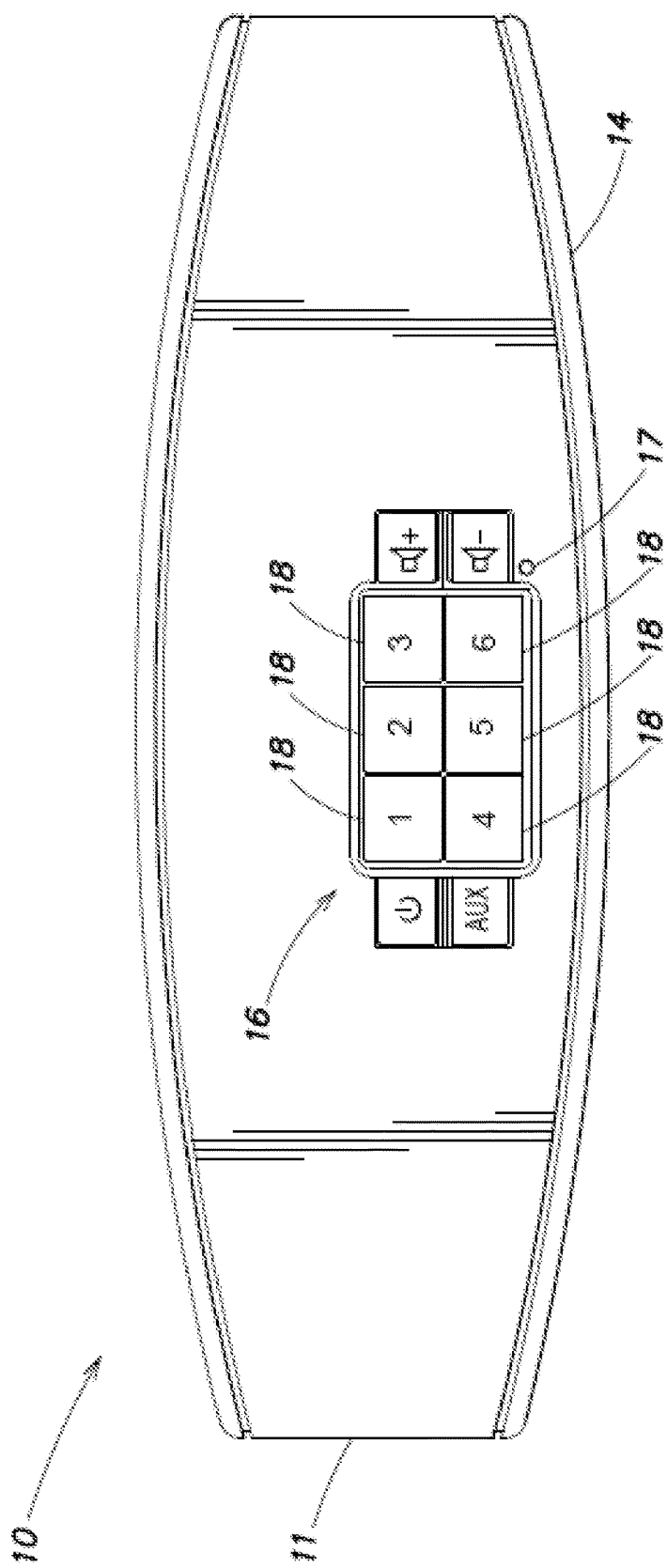
FIG. 1B is a plan view of the streaming audio player device of FIG. 1.
Figure 1C:
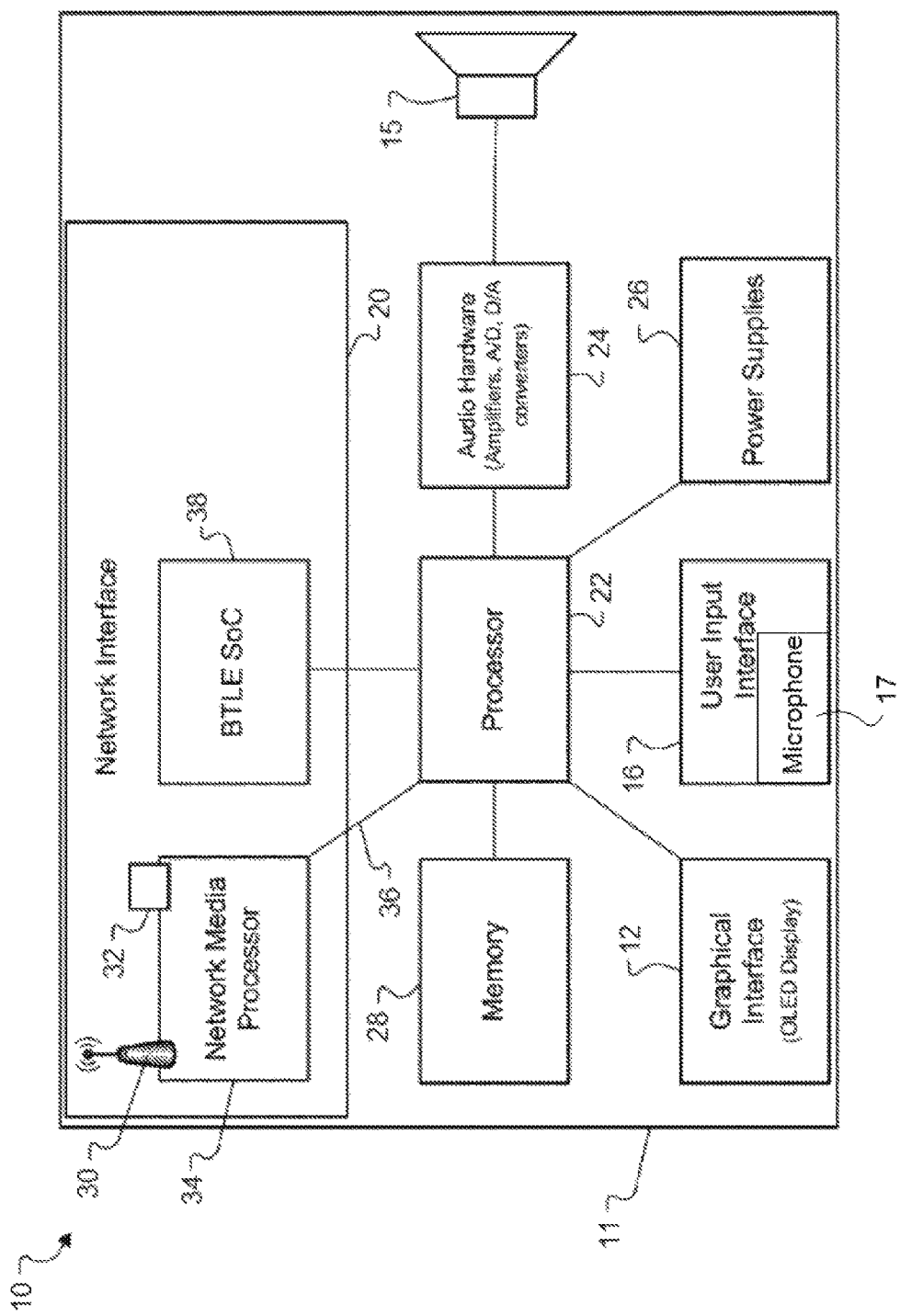
FIG. 1C illustrates electronic modules included in the streaming audio player of FIG. 1.

FIG. 1A illustrates an exemplary streaming audio player 10 including an enclosure 11. A graphical interface 12 (e.g., an OLED display) resides on the enclosure 11 which can provide a user with information regarding currently playing ("Now Playing") audio content (e.g., streaming music) or other information regarding the system status. A screen 14 conceals one or more electro-acoustic transducers 15 (FIG. 1C). The streaming audio player 10 also includes a user input interface 16. As shown in FIG. 1B, the user input interface 16 includes a plurality of preset indicators 18, which are hardware buttons in the illustrated example. The preset indicators 18 (numbered 1-6) provide the user with easy, one press access to entities assigned to those buttons.

As illustrated in FIG. 1B, the user input interface 16 may also include one or more microphones 17 to receive voice queries or commands from a user. In some implementations, the one or more electro-acoustic transducers 15 (FIG. 1C) may be utilized both to render audio content and to receive voice queries or commands from a user.

With reference to FIG. 1C, the streaming audio player 10 also includes a network interface 20, a processor 22, audio hardware 24, power supplies 26 for powering the various streaming audio player components, and memory 28. Each of the processor 22, the graphical interface 12, the network interface 20, the audio hardware 24, the power supplies 26, and the memory 28 are interconnected using various buses, and several of the components may be mounted on a common motherboard or in other manners as appropriate. VPA functionality may be included in the processor 22 with associated programming residing in, for example, the memory 28.

The network interface 20 may provide either or both of a wireless interface 30 and a wired interface 32. The wireless interface 30 allows the streaming audio player 10 to communicate wirelessly with other devices in accordance with a communication protocol such as IEEE 802.11b/g. The wired interface 32 provides network interface functions via a wired (e.g., Ethernet) connection.

Digital audio coming from network packets may be directed from the network media processor 34 through a USB bridge 36 to the processor 22 and run into the decoders, DSP, and eventually be played back (rendered) via the electro-acoustic transducer(s) 15.

The network interface 11 can also include a Bluetooth low energy (BTLE) system-on-chip (SoC) 38 for Bluetooth low energy applications (e.g., for wireless communication with a Bluetooth enabled controller. A suitable BTLE SoC is the CC2540 available from Texas Instruments, with headquarters in Dallas, Tex.

Streamed data passes from the network interface 20 to the processor 22. The processor 22 can execute instructions within the streaming audio player (e.g., for performing, among other things, digital signal processing, decoding, and equalization functions), including instructions stored in the memory 28. The processor 22 may be implemented as a chipset of chips that include separate and multiple analog and digital processors. The processor 22 may provide, for example, for coordination of other components of the streaming audio player 10, such as control of user interfaces, or applications run by the streaming audio player 10.

The processor 22 provides a processed digital audio signal to the audio hardware 24 which includes one or more digital-to-analog (D/A) converters for converting the digital audio signal to an analog audio signal. The audio hardware 24 also includes one or more amplifiers which provide amplified analog audio signals to the electroacoustic transducer(s) 15 for playback. In addition, the audio hardware 24 may include circuitry for processing analog input signals to provide digital audio signals for sharing with other devices.

The memory 28 stores information within the streaming audio player 10. In this regard, the memory 28 may store account information, such as information regarding the audio station or channel presets.

The memory 28 may include, for example, flash memory and/or non-volatile random access memory (NVRAM). In some implementations, instructions (e.g., software) are stored in an information carrier. The instructions can also be stored by one or more storage devices, such as one or more computer- or machine-readable mediums (for example, the memory 28, or memory on the processor). The instructions may include instructions for performing decoding (i.e., the software modules include the audio codecs for decoding the digital audio streams), as well as digital signal processing and equalization.

The network interface 20 provides for communication between the streaming audio player 10 and a controller (for example, a remote control or a smart phone or computer having an appropriate control application installed), a server connected to the Internet or cloud-based server that may contain an account database including information regarding an audio system account of a user, audio sources, and other streaming audio players 10 via one or more communications protocols. The network interface 20 may also provide for communication between the streaming audio player 10 and a cloud-based service, for example, Alexa Voice Service, used to obtain information in response to a query by a user to use to prepare and render an audio response to the query of the user. Communication between the network interface 20 and the cloud-based service may be through an internet router. The service will take an uploaded audio (voice) file, recorded by the microphone 17, and will perform automatic speech recognition and natural language understanding on the voice file to provide an appropriate response. The response will be fed back to the streaming audio player 10, for example, as a digital audio file. For example, a user may ask the VPA residing on the streaming audio player 10 what the current weather forecast is. The VPA will provide a recorded voice file with that inquiry to the voice service, and will receive therefrom a digital audio file that includes the local weather forecast for playback on the streaming audio player 10.

Figure 2A:
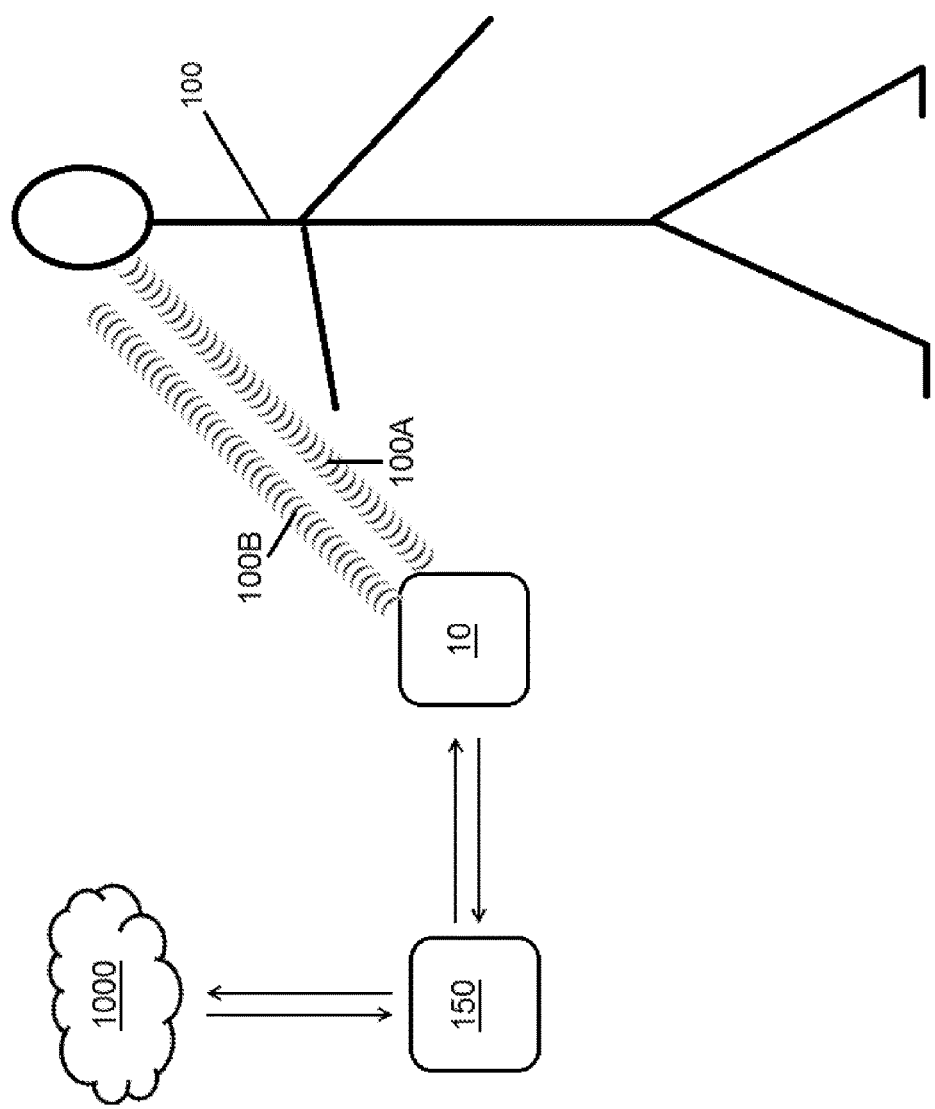
FIG. 2A illustrates communications between a user and a streaming audio player including VPA functionality.

FIG. 2A illustrates a user 100 proving a spoken query 100A (e.g., triggered by the utterance of a wake word) to a streaming audio player 10 including VPA functionality as disclosed herein. The streaming audio player 10 recognizes the spoken query 100A and accesses a cloud-based service in the cloud 1000 via an internet router 150 and obtains information necessary to respond to the query 100A. The streaming audio player 10 receives the requested information from the cloud-based service in the cloud 1000 via the internet router 150, performs a text-to-speech transformation of the received information if the received information is not already in audio format, and provides a response 100B to the query 100A via synthesized speech. In some cases, the cloud-based service may provide the requested information in audio formation (e.g., the cloud-based service may perform text-to-speech transformation of search results). If the streaming audio player 10 were playing entertainment audio, for example, music when the response 100B to the query 100A was to be rendered, the response 100B to the query 100A may be rendered at an elevated volume relative to the entertainment audio. The entertainment audio may be temporarily reduced in volume or turned off during rendering of the response 100B to the query 100A.

In other implementations, VPA functionality, e.g., sending a request for information to a VPA service provider or other source of information and receiving a response to the request for information from the VPA service provider or other source of information may be performed in a device separate from a device that receives a user query or command or renders the response to the user query or command. For example, in some implementations the streaming audio player 10 may lack functionality to send a request for information to a VPA service provider or other source of information and receive a response to the request for information from the VPA service provider or other source of information. The streaming audio player 10 may thus communicate with a separate device including VPA functionality to send and receive information from the VPA service provider or other source of information.

Figure 2B:
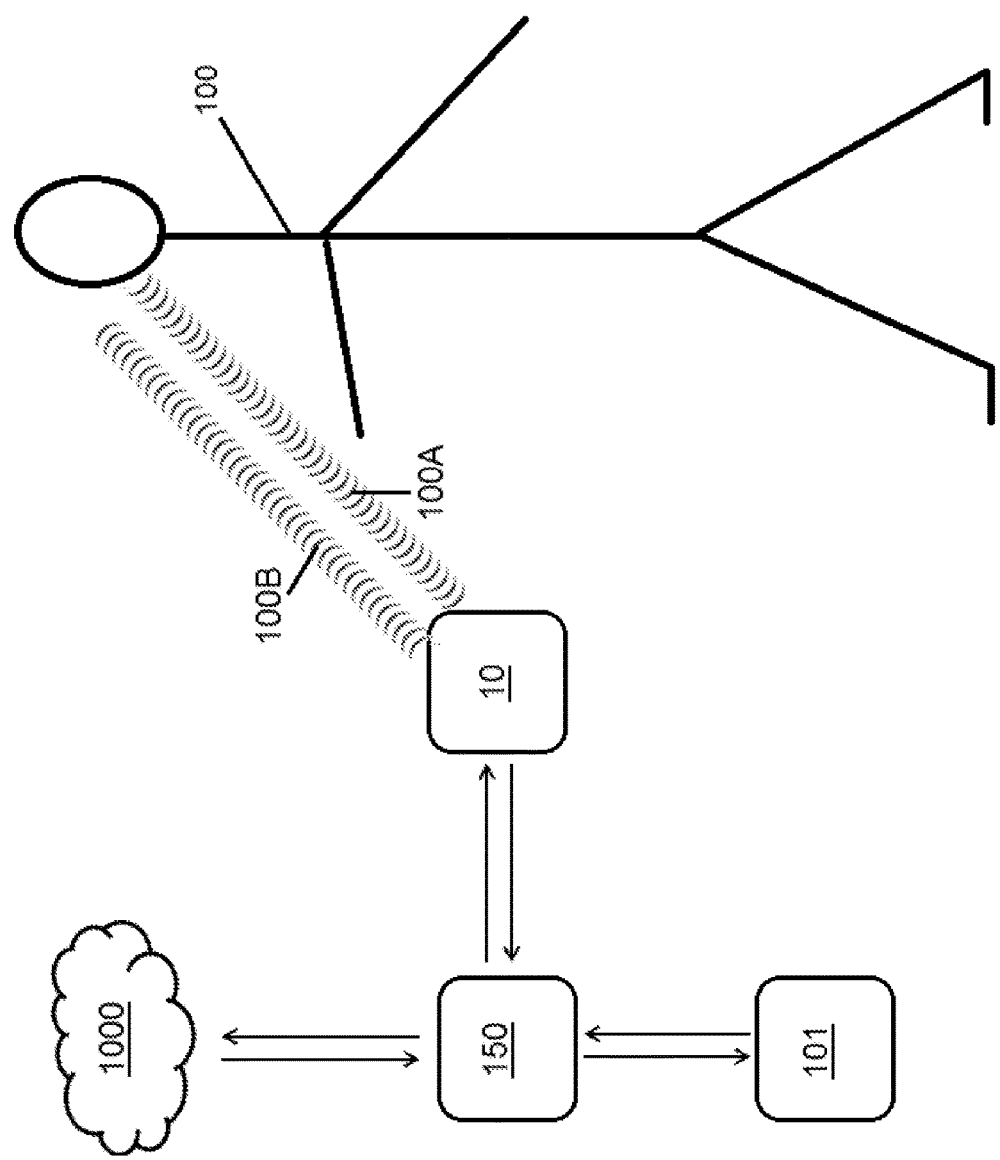
FIG. 2B illustrates communications between a user and a streaming audio player and between the streaming audio player and a separate device including VPA functionality.

As illustrated in FIG. 2B, a user 100 may provide a spoken query 100A to a streaming audio player 10. The user 100 may speak a wake word to the streaming audio player 10 prior to providing the spoken query 100A so the streaming audio player 10 will interpret the spoken query 100A as one to which the user 100 desires a response. The streaming audio player 10 may relay the spoken query 100A, optionally after recording the spoken query 100A, to a VPA enabled device 101 (also referred to herein as simply a "VPA") having the ability to request and receive a response to the user query 100A from a VPA service provider or other source of information as described above, for example, to service provider or other source of information in the cloud 1000. The VPA 101 may receive a response to the user query from the VPA service provider or other source of information and communicate the response to the streaming audio player 10 for rendering. The streaming audio player 10 may render the response as an audio response 100B to the user 100 after applying appropriate equalization to the response as disclosed herein.

The VPA 101 may include a processor, a memory, and a network interface that may be configured or may include functionality similar to the processor 22, memory 28, and network interface 20 described above with reference to the streaming audio player 10. The processor of the VPA 101 may implement instructions stored in the memory of the VPA 101 that provides for the VPA 101 to send a request for information to a VPA service provider or other source of information and receive a response to the request for information from the VPA service provider or other source of information as well as to receive queries from the streaming audio player 10 and to send responses to queries to the streaming audio player 10.

Communications between the streaming audio player 10 and VPA 101 may be through a router 150 as illustrated in FIG. 2B or may be in the form of direct communication (wired or wireless) between the streaming audio player 10 and VPA 101.

It should be understood that reference to an streaming audio player 10 herein includes systems in which a single component receives spoken user queries and provides audio responses to a user as well as requests and receives responses to the queries from an external source, as well as to systems as illustrated in FIG. 2B in which a first device (e.g., n streaming audio player 10) receives user queries and renders responses to a user and a second device (e.g., a VPA 101) requests and receives responses to the user queries and communicates the responses to the first device for rendering.

In accordance with some aspects and implementations, the memory 28 of the streaming audio player 10 includes instructions that when executed by the processor causes the processor to label audio streams with labels (also referred to herein as digital tags or simply tags) specific to the type of content included in the stream. For example, the processor may include a first type of digital tag in an audio stream including a VPA response to a user query or command identifying the first audio stream as such and may include a second type of digital tag in a second audio stream including music identifying the second audio stream as entertainment audio. When rendering an audio stream the audio hardware 24 of the streaming audio player 10 may apply different signal conditioning, for example, different types of equalization to the audio stream based on the type of digital tag included in the audio stream. For example, if the digital tag in an audio stream is a digital tag associated with music, the audio hardware 24 of the streaming audio player 10 may render the audio stream with a higher amplitude of bass frequencies than if the digital tag was one associated with speech. If the digital tag in an audio stream is a digital tag associated with a response to a user query made to the streaming audio player 10 the audio hardware 24 of the streaming audio player 10 may render the audio stream with a lesser amplitude of bass frequencies than if the digital tag was one associated with music such that the response may be easier for the user to understand.

The processor of the streaming audio player 10 may differentiate audio streams into more than just streams including a VPA response to a user query or command and audio streams including entertainment audio. The processor of the streaming audio player 10 may differentiate audio streams into further classifications, such as spoken voice, entertainment audio, chimes indicative of, for example, a doorbell ringing or a text message or phone call being received, or different types of music, for example, classical music vs. rock music. The processor may embed digital tags representative of any of these different types of audio in audio streams received at the streaming audio player 10 and different predetermined equalization profiles may be applied to each different type of audio based on the particular digital tag embedded in the respective audio streams. The different types of audio may include, for example, voice (e.g., text-to-speech, talk-radio, news broadcast), music, movie, audio-chime, etc. The different types of audio in the audio streams may be identified by the processor of the streaming audio player 10 based on one or more of the frequency profiles associated with the different types of audio that the processor of the streaming audio player 10 may attempt to match to audio in a particular audio stream, sources of the different types of audio, or other identifying metadata already present in the audio streams including the different types of audio.

Figure 1D:
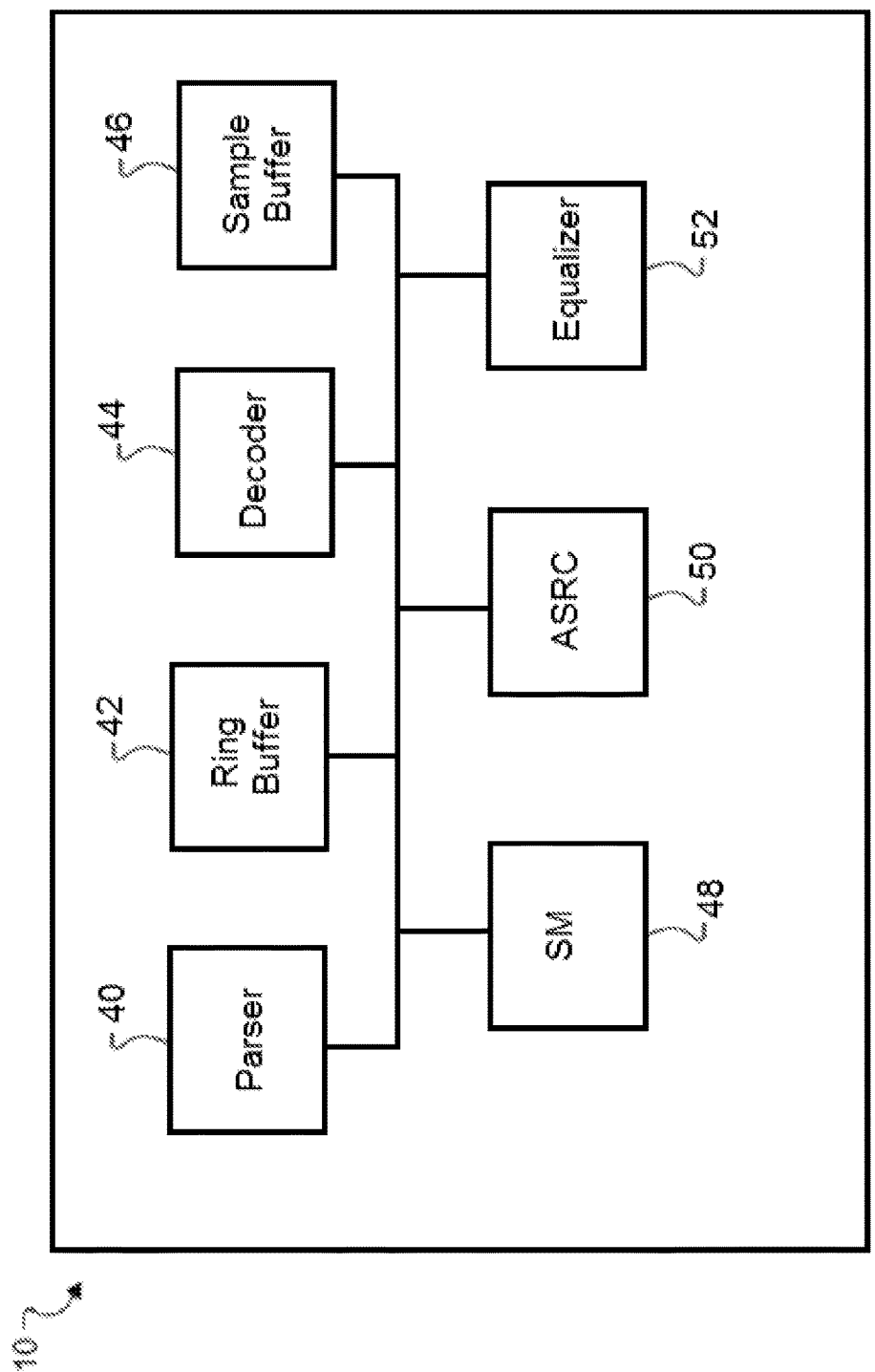
FIG. 1D illustrates additional electronic modules included in the streaming audio player of FIG. 1.

As illustrated in FIG. 1D the streaming audio player 10 may include a parser 40, a ring buffer 42, a decoder 44, a sample buffer 46, a synchronization module (SM) 48, an asynchronous sample rate converter (ASRC) 50, and an equalizer 52. These components may be in addition to the components illustrated in FIG. 1C or may be included in, for example, the processor 22, audio hardware 44, and/or memory 28 illustrated in FIG. 1C. At the beginning of a stream, the data (encoded audio, e.g., entertainment audio or a response to a voice request) starts to flow to the streaming audio player 10 where it is parsed by the parser 40 to identify frame boundaries. The parser 40 strips away any container (e.g., MP3) that encoded audio is packed in. The streaming audio player 10 determines the type of the encoded audio, and appends a digital tag associated with the type of the encoded audio to the packet header of the encoded audio. The parsed but still encoded data is stored in the master's ring buffer 42. Next, the encoded data is decoded and a time offset is generated and affixed to the header of the audio frame and the decoded audio frames are stored in the sample buffer 46. The offset is used by the synchronization module 48 to determine when the audio samples from the corresponding audio frame are fed into the ASRC 50. The ASRC 50 ensures a constant sample-rate for rendering. The output of the ASRC 50 is fed into the equalizer 52, which applies the appropriate equalization profile (as indicated by the digital tag) before it is fed to a digital to analog converter of the audio hardware 44 and ultimately transduced to acoustic energy by the transducer 15.

In some implementations, multiple streaming audio players 10 may be grouped together to provide synchronized, multi-room playback. Generally, in such a group, one of the devices will serve the role of a master, and the remaining devices will operate as slaves. The master device will provide an audio stream, playback timing information, and a master clock time to the slaves. The slaves can then use the playback timing information and master clock time to reproduce the streamed audio in synchrony with the master—and with each other. The master device provides the clock data (i.e., the master device acts as a time server) to the slave devices, which then use that clock data to update their respective clocks to synchronize with that of the master device. The clock data may be provided periodically (e.g., every 1 to 6 seconds) to keep the slave devices updated and in sync with the master.

The master device also provides a "play at" time to the slave devices. This "play at" time represents the time that the devices are to start playing a first sample in an audio stream. The "play at" time may be communicated in control data that is separate from the audio stream. Every new track or stream will get a new "play at" time.

The slave devices receive the first sample in a stream and begin playback at the designated "play at time." Since all devices have the same current clock time, they all begin playback at the same time. From there, the devices all provide playback at a constant sample rate, and, consequently, stay in sync.

For multi-room synchronization, the encoded data is immediately pulled out of the master's ring buffer and is provided to the slave playback device(s) (a/k/a slave(s)) ring buffer. From there, the slaves follow the same process as outlined above. Each slave will decode the encoded audio pulled from the master, assign an offset to the frame header, and store the decoded audio frames in their respective sample buffers. The slaves each apply their own offsets to the audio frames, but these offsets will be the same as those applied by the master since each device is receiving the same stream and is using the same decoder software. The slave devices will also use the digital tag that was appended to the audio data to apply the appropriate equalization profile to the audio. In that regard, each device may have a library of equalization profiles stored in memory—a look-up table can be used to associate the digital tag with a corresponding equalization profile. In some examples, a same tag could cause different slave devices to utilize different equalization profiles for audio content, for example, based on previous user input and selection. For example, a particular internet radio station may be rendered with an equalization profile associated with voice content on one slave device, and with an equalization profile associated with music on another slave device.

Figure 3A:
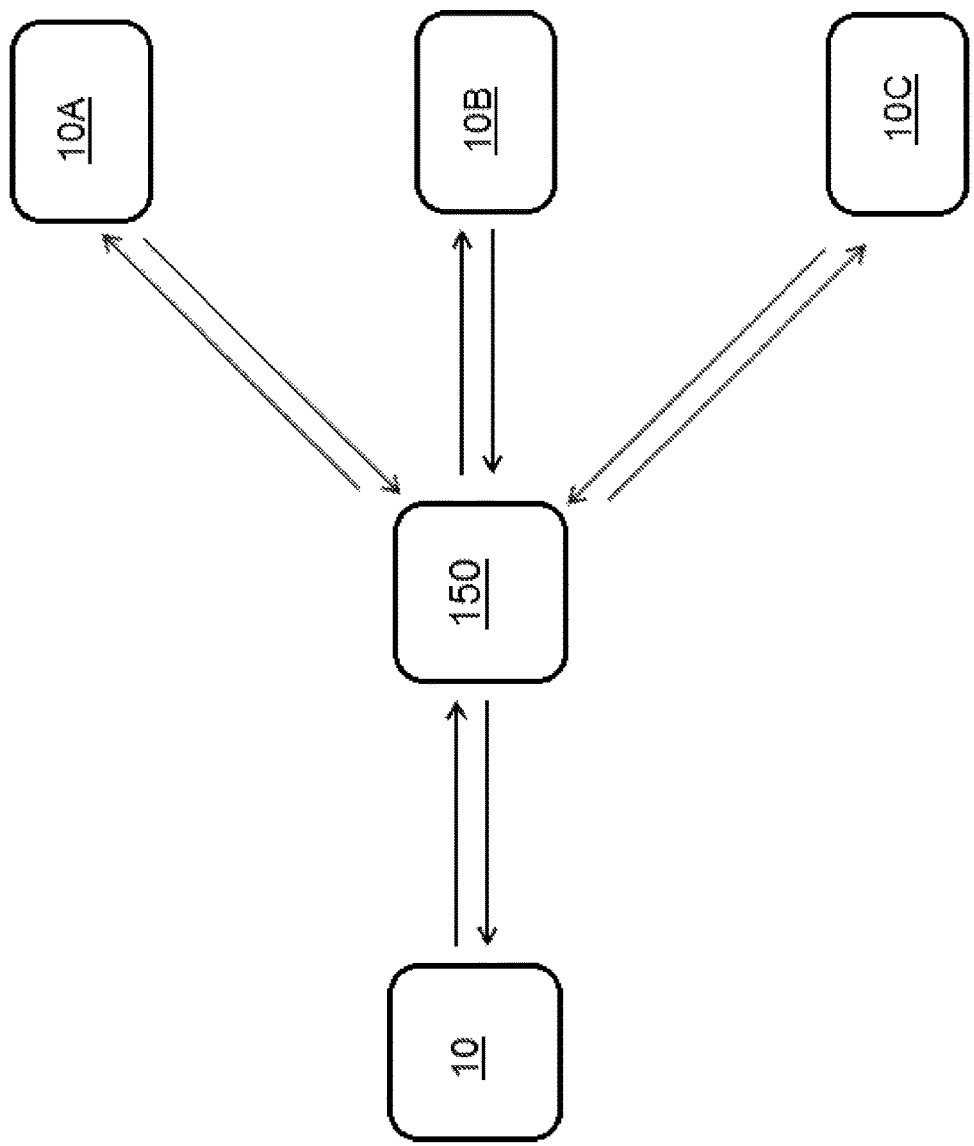
FIG. 3A illustrates communications between a master streaming audio player and slave streaming audio players through a router.
Figure 3B:
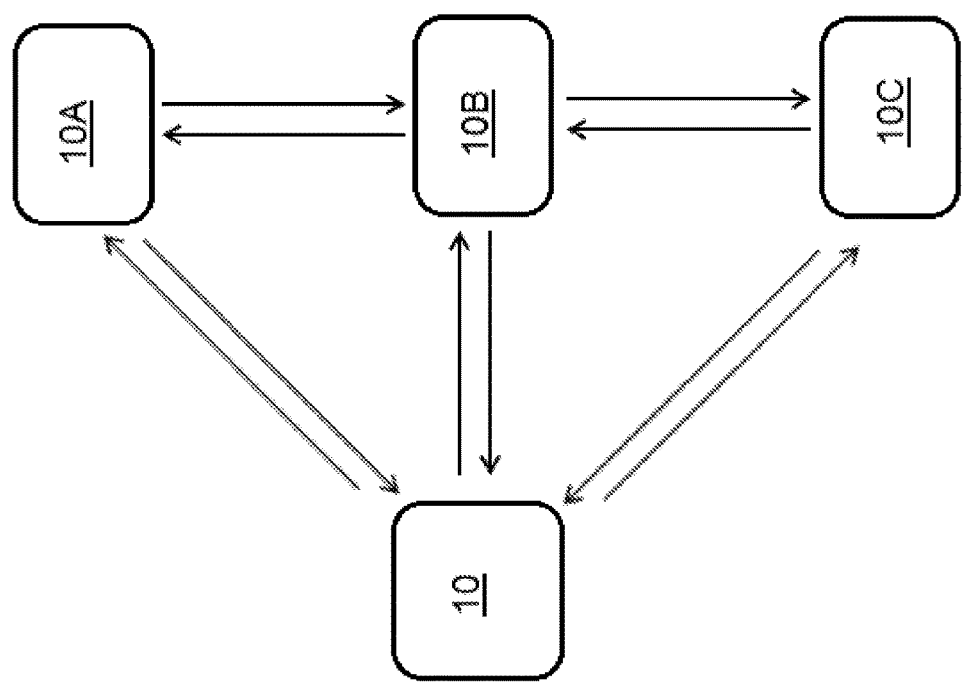
FIG. 3B illustrates direct communications between a master streaming audio player and slave streaming audio players.

For example, as illustrated in FIG. 3A, a master streaming audio player 10 may be in communication with one or more slave streaming audio players 10A, 10B, 10C via a router 150. Alternatively, as illustrated in FIG. 3B, the master streaming audio player 10 and slave streaming audio players 10A, 10B, 10C may be in direct communication with one another, for example, utilizing the network interfaces in each of the master and slave devices.

VPA functionally of the master streaming audio player 10 and/or slave streaming audio players 10A, 10B, 10C may be triggered by a wake word from a user that is detected by the master streaming audio player 10 and/or slave streaming audio players 10A, 10B, 10C, which is then followed by a voice request. The one of the master streaming audio player 10 and/or slave streaming audio players 10A, 10B, 10C that detects the wake word and user voice request or query 100A will record the voice request when its microphone 17 detects the wake word. If it is the master streaming audio player 10 that receives the user voice request or query 100A it may provide a synthesized voice response 100B to the user as described above.

In some instances, one of the slave streaming audio players 10A, 10B, 10C may receive the voice request. Since a user may not know which device in a group is the master streaming audio player 10, or even that there is a master streaming audio player 10, the user may unknowingly direct a voice request to one of the slave streaming audio players 10A, 10B, 10C (e.g., the user may simply direct a voice request to the streaming audio player that is closest to him/her). The recipient slave streaming audio player 10A, 10B, 10C could communicate the voice request to a cloud-based voice service; however, typically, a response from a cloud-based voice service is provided back over a secure socket to the same device that communicated the voice request to the cloud-based voice service—meaning the response from the voice service may be returned to the recipient slave streaming audio player 10A, 10B, 10C, which may be otherwise ill equipped to distribute the audio to the other streaming audio players. To address this, in situations in which a voice request is picked-up by a microphone 17 of a slave streaming audio player 10A, 10B, 10C, the slave streaming audio player can forward the corresponding audio file to the master streaming audio player 10 for communicating the same to the cloud-based voice service. This ensures that the response will be directed back to the master streaming audio player 10, which can then label and distribute the audio to the slave streaming audio players 10A, 10B, 10C. In some instances, the master streaming audio player 10 may record an indication of which of the slave streaming audio players 10A, 10B, 10C forwarded the user request 100A to the master streaming audio player 10, and may forward the response 100B to the same slave streaming audio player that forwarded the user request 100A to the master streaming audio player 10. Alternatively, the response 100B may be sent to each slave streaming audio player 10A, 10B, 10C for rendering. The response 100B may also or alternatively be rendered by the master streaming audio player 10.

One option for distributing a VPA synthesized voice response 100B to a user query 100A would be to mix it, at the master streaming audio player 10, with any entertainment audio stream that may be playing, and then distribute a single, mixed audio stream for playback at the slave streaming audio players 10A, 10B, 10C. This option takes advantage of the fact that the slave streaming audio players 10A, 10B, 10C are already synchronized to the clock time of the master streaming audio player 10. A problem with that option, however, is that the slave streaming audio players 10A, 10B, 10C may not be able to distinguish and separate the voice response 100B from the entertainment audio, and, thus, will not be able to apply different equalization profiles (e.g., different levels of amplification of different frequency bands) to those audio types prior to rendering.

To more easily enable slave streaming audio players 10A, 10B, 10C to distinguish different types of audio streams (e.g., VPA responses 100B v. entertainment audio) the master streaming audio player 10 may distribute multiple separate streams of audio to the slave streaming audio players 10A, 10B, 10C, each audio stream having its own playback timing information. The streams may be distributed in parallel. These streams may include one stream for the entertainment audio, and a separate stream for a VPA response 100B to a voice request. The slave streaming audio players 10A, 10B, 10C may already be synchronized to the clock of the master streaming audio player 10 for playback of the entertainment audio. However, on the slave side, each audio stream may be processed separately (e.g., each stream may have its own buffer, decoder, asynchronous sample rate converter (ASRC), and equalization profile), allowing for different equalization to be applied to the different streams. The processing of the two streams can be done in parallel. Since the slave streaming audio players 10A, 10B, 10C would generally be unaware of the content type or source of the content in an audio stream, the master streaming audio player 10 can label the streams with the corresponding content type to ensure that the appropriate equalization is applied by the slave streaming audio players 10A, 10B, 10C prior to rendering the content. For example, the master streaming audio player 10 may include an identification of the audio content type in the header of audio packets provided to the slave streaming audio players 10A, 10B, 10C. The slave streaming audio players 10A, 10B, 10C may be pre-programmed with different equalization profiles (e.g., different amplification factors for different frequencies in an audio stream) to apply to different types of audio content based on the identification of the audio content type provided in the audio streams communicated from the master streaming audio player 10. The slave streaming audio players 10A, 10B, 10C may be pre-programmed with different volumes at which to render different types of audio content based on the identification of the audio content type provided in the audio streams communicated from the master streaming audio player 10. The slave streaming audio players 10A, 10B, 10C may be pre-programmed to alter the volume of a first audio stream being rendered upon receipt of a second type of audio stream so the second type of audio stream may be audible over the first. For example, the slave streaming audio players 10A, 10B, 10C may be pre-programmed to reduce the volume of entertainment audio being rendered when a VPA response 100B is received and while the VPA response 100B is being rendered so that the VPA response 100B may be audible over the entertainment audio.

In other examples, the different equalization profiles and/or volume adjustments may be applied by the master streaming audio player 10 to the different types of audio streams prior to sending the different types of audio streams to the slave streaming audio player(s) 10A, 10B, 10C for rendering. For example, the master streaming audio player 10 may apply equalization emphasizing lower frequencies in an audio stream identified as including rock music and may apply equalization emphasizing higher frequencies in an audio stream identified as including voice or a VPA response 100B. In such examples, the audio streams received at the slave streaming audio player(s) 10A, 10B, 10C for rendering may already have had appropriate equalization applied thereto by the master streaming audio player 10 and the slave streaming audio player(s) 10A, 10B, 10C may not need to check for tags identifying the type of audio in the audio streams or to apply audio type specific equalization the received audio streams.

Implementations are not limited to sending only two types of audio streams (e.g., entertainment audio and VPA responses 100B) from a master streaming audio player 10 to slave streaming audio players 10A, 10B, 10C. In some examples a master streaming audio player 10 may synchronize and send additional audio streams with different identification labels to slave streaming audio players 10A, 10B, 10C. One example of an additional type of audio stream may be audio chimes, for example, indicators of a doorbell being rung or of an incoming telephone call or text message. The slave streaming audio players 10A, 10B, 10C can follow the same rules as described above with respect to the VPA responses 100B to apply different equalization profiles to audio streams labeled as audio chimes than to audio streams labeled as entertainment audio. In other examples, a prioritization hierarchy may be defined in memories of the slave streaming audio players 10A, 10B, 10C (or the master streaming audio player 10) for the different types of audio. Based on the prioritization hierarchy, an audio stream including a first type of audio, for example, an audio chime or a VPA response 100B may be rendered at a higher volume than a concurrently received audio stream including a second type of audio, for example, music that may be considered less important than the first type of audio.

Having thus described several aspects of at least one implementation, it is to be appreciated various alterations, modifications, and improvements will readily occur to those skilled in the art. Such alterations, modifications, and improvements are intended to be part of this disclosure, and are intended to be within the spirit and scope of the disclosure. The acts of methods disclosed herein may be per- formed in alternate orders than illustrated, and one or more acts may be omitted, substituted, or added. One or more features of any one example disclosed herein may be combined with or substituted for one or more features of any other example disclosed. Accordingly, the foregoing description and drawings are by way of example only.

The phraseology and terminology used herein is for the purpose of description and should not be regarded as limiting. As used herein, the term "plurality" refers to two or more items or components. As used herein, dimensions which are described as being "substantially similar" should be considered to be within about 25% of one another. The terms "comprising," "including," "carrying," "having," "containing," and "involving," whether in the written description or the claims and the like, are open-ended terms, i.e., to mean "including but not limited to." Thus, the use of such terms is meant to encompass the items listed thereafter, and equivalents thereof, as well as additional items. Only the transitional phrases "consisting of" and "consisting essentially of," are closed or semi-closed transitional phrases, respectively, with respect to the claims. Use of ordinal terms such as "first," "second," "third," and the like in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

What is claimed is:

1. An audio playback system including a processor and associated programming, the programming, when executed on the processor, causing the audio playback system to perform a method comprising:
    identifying a first type of audio included in a first audio stream;
    tagging the first audio stream with a first digital tag corresponding to the first type of audio;
    identifying a second type of audio included in a second audio stream;
    tagging the second audio stream with a second digital tag corresponding to the second type of audio;
    identifying an audio chime included in a third audio stream; and
    tagging the third audio stream with a third digital tag corresponding to the audio chime;
    wherein the audio playback system includes a master streaming audio player and at least one slave streaming audio player, the at least one slave streaming audio player configured to render the first audio stream with a first equalization profile applied thereto, the first equalization profile selected responsive to the at least one slave streaming audio player detecting the first digital tag in the first audio stream, to render the second audio stream with a second equalization profile different from the first equalization profile applied thereto, the second equalization profile selected responsive to the at least one slave streaming audio player detecting the second digital tag in the second audio stream, and to render the third audio stream with a third equalization profile different from the first equalization profile and different from the second equalization profile applied thereto, the third equalization profile selected responsive to the at least one slave streaming audio player detecting the third digital tag in the third audio stream.

2. The audio playback system of claim 1, wherein the at least one slave streaming audio player is configured to identify a spoken user query and communicate the user query to the master streaming audio player, and wherein the master streaming audio player is configured to generate a response to the user query and communicate the response to the user query in the first audio stream to the at least one slave streaming audio player for rendering, the first digital tag included in the first audio stream identifying the first audio stream as including the response to the user query.

3. The audio playback system of claim 2, wherein the at least one slave streaming audio player reduces a volume of an audio stream being rendered through the at least one slave streaming audio player responsive to detecting a wake word spoken by the user.

4. The audio playback system of claim 2, wherein only a slave streaming audio player that identifies the user query renders the response to the user query.

5. The audio playback system of claim 2, wherein each streaming audio player in the system renders the response to the user query.

6. The audio playback system of claim 2, wherein the master streaming audio player is further configured to communicate the second audio stream to the at least one slave streaming audio player, the second digital tag in the second audio stream identifying the second audio stream as including audio other than the response to the user query, and the at least one slave streaming audio player is configured to identify the second digital tag in the second audio stream and to apply the second equalization profile to the second audio stream responsive to detecting the second digital tag.

7. The audio playback system of claim 1, wherein the first equalization profile, second equalization profile, and third equalization profile are programmed into and associated with the respective first, second, and third digital tags in the at least one slave streaming audio player.

8. The audio playback system of claim 1, wherein if the at least one slave streaming audio player receives an audio stream including the first digital tag while rendering the second audio stream, the at least one slave streaming audio player reduces a volume of the second audio stream and renders the audio stream including the first digital tag at a higher volume relative to the second audio stream.

9. The audio playback system of claim 1, wherein the processor identifies a type of audio in any of the first, second, or third audio stream based on frequency profiles associated with different types of audio that the processor attempts to match to the audio in the first, second, or third audio streams.

10. The audio playback system of claim 1, wherein the at least one slave audio player includes at least two slave audio players, different ones of the at least two slave audio players configured to apply different equalization profiles to an audio stream including a same digital tag.

11. A method comprising:
    receiving a user query spoken by a user at a microphone of a streaming audio system;
    receiving a first audio stream including a speech response to the user query;
    including a first indicator in the first audio stream that identifies the first audio stream as including the speech response to the user query;
    rendering the speech response to the user query with the streaming audio system with a first equalization profile applied to the response to the user query, the first equalization profile being applied to the response to the user query responsive to the system detecting the first indicator in the first audio stream; and rendering entertainment audio with the streaming audio system with a second equalization profile applied to the entertainment audio, the second equalization profile being different than the first equalization profile.

12. The method of claim 11, wherein the streaming audio system includes a slave streaming audio player operating under control of a master streaming audio player and the method further comprises:

communicating the user query from the slave streaming audio player to the master streaming audio player; and communicating the response to the user query from the master streaming audio player to the slave streaming audio player.

13. The method of claim 12, further comprising the master streaming audio player communicating the user query to a cloud-based service and receiving the response to the user query from the cloud-based service.

14. The method of claim 12, further comprising the master streaming audio player including the first indicator identifying the first audio stream as including the response to the user query in the first audio stream, wherein communicating the response to the user query from the master streaming audio player to the slave streaming audio player comprises communicating the first audio stream from the master streaming audio player to the slave streaming audio player.

15. The method of claim 14, wherein the slave streaming audio player applies the first equalization profile to the response to the user query responsive to identifying the first indicator in the first audio stream.

16. The method of claim 15, further comprising the master streaming audio player including a second indicator identifying a second audio stream as including the entertainment audio in the second audio stream, wherein the slave streaming audio player renders the entertainment audio with a second equalization profile applied thereto responsive to identifying the second indicator in the second audio stream.

17. The method of claim 15, wherein the slave streaming audio player reduces a volume of entertainment audio being rendered on the slave streaming audio player responsive to receiving the first audio stream and identifying the first indicator in the first audio stream and the slave streaming audio player renders the response to the user query at an increased volume relative to the volume of the entertainment audio.

18. The method of claim 11, further comprising the streaming audio system streaming the entertainment audio from a streaming music service.

19. The method of claim 11, wherein the streaming audio system identifies a wake word preceding the user query and lowers a volume of the entertainment audio responsive to identifying the wake word.

20. A streaming audio player comprising:
a digital-to-analog converter;
an electro-acoustic transducer coupled to the digital-to-analog converter;
a network interface;
a processor coupled to the digital-to-analog converter, and the network interface; and
instructions stored on a non-transitory computer readable medium that, when executed, cause the processor to:
receive first digital audio data via the network interface;
identify the first digital audio data as being a response to a spoken user query;
append a first digital tag to the first digital audio data, the first digital tag identifying the first digital audio data as being the response to the spoken user query;
select a first equalization profile from a plurality of equalization profiles based on the first digital tag appended to the first digital audio data; and
equalize the first digital audio data according to the first equalization profile.

21. The streaming audio player of claim 20, wherein the first digital audio data comprises a response to the spoken user query that is received from a cloud-based service.

22. The streaming audio player of claim 21, wherein the instructions, when executed, further cause the processor to transmit the first digital audio data, with the first digital tag appended thereto, to one or more other streaming audio players via the network interface for rendering of the first digital audio data on the one or more other streaming audio players.

23. The streaming audio player of claim 20, wherein the instructions, when executed, further cause the processor to:
receive second digital audio data via the network interface;
select a second equalization profile from the plurality of equalization profiles based on a second digital tag associated with the second digital audio data; and
equalize the second digital audio data according to the second equalization profile, wherein the second equalization profile is different from the first equalization profile.

24. The streaming audio player of claim 23, wherein the streaming audio player is configured to render the first digital audio data, as equalized according to the first equalization profile, and the second digital audio data, as equalized according to the second equalization profile, concurrently.

25. The streaming audio player of claim 24, wherein the streaming audio player is configured to reduce a volume of the rendered second digital audio data while it is rendering the first digital audio data.

26. The streaming audio player of claim 23, wherein the instructions, when executed, further cause the processor to:
append the second digital tag to the second digital audio data, wherein the second digital tag identifies the second digital audio data as entertainment audio data.

27. The streaming audio player of claim 26, wherein the instructions, when executed, further cause the processor to transmit the second digital audio data, with the second digital tag appended thereto, to one or more other streaming audio players via the network interface for rendering of the second digital audio data on the one or more other streaming audio players.

28. The streaming audio player of claim 27, wherein the streaming audio player is configured to transmit the first digital audio data and the second digital audio data concurrently to the one or more other streaming audio players.

29. The streaming audio player of claim 20, wherein the streaming audio player is configured to:
receive the spoken user query from a user;
transmit the spoken user query via the network interface to a cloud-based service; and
receive the response to the spoken user query via the network interface from the cloud-based service.

30. The streaming audio player of claim 29, wherein the streaming audio player comprises a microphone, and wherein the spoken user query is received via the microphone.

31. The streaming audio player of claim 29, wherein the spoken user query is received via the network interface from another streaming audio player.

\* \* \* \* \*